(12) United States Patent
Yim et al.

(10) Patent No.: US 8,361,549 B2
(45) Date of Patent: Jan. 29, 2013

(54) POWER LOADING SUBSTRATES TO REDUCE PARTICLE CONTAMINATION

(75) Inventors: Dong-Kil Yim, Sungnam (KR); John M. White, Hayward, CA (US); Soo Young Choi, Fremont, CA (US); Han Byoul Kim, Chon An (KR); Jin Man Ha, Yuseong-gu (KR); Beom Soo Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/315,366

(22) Filed: Dec. 9, 2011

(65) Prior Publication Data
US 2012/0082802 A1 Apr. 5, 2012

Related U.S. Application Data

(63) Continuation of application No. 11/478,279, filed on Jun. 29, 2006, now Pat. No. 8,075,952.

(51) Int. Cl.
*C23C 16/00* (2006.01)
*H05H 1/24* (2006.01)
(52) U.S. Cl. ..................................... 427/248.1; 427/569
(58) Field of Classification Search ............... 427/248.1, 427/569
See application file for complete search history.

(56) References Cited

U.S. PATENT DOCUMENTS

| | | | |
|---|---|---|---|
| 4,872,947 A | 10/1989 | Wang et al. | |
| 5,380,566 A | 1/1995 | Robertson et al. | |
| 5,844,205 A | 12/1998 | White et al. | |
| 5,931,721 A | 8/1999 | Rose et al. | |
| 5,967,156 A | 10/1999 | Rose et al. | |
| 6,106,634 A | 8/2000 | Ghanayem et al. | |
| 6,192,601 B1 | 2/2001 | Ghanayem et al. | |
| 6,203,406 B1 | 3/2001 | Rose et al. | |
| 6,379,572 B1 | 4/2002 | Kikuchi et al. | |
| 6,559,026 B1 | 5/2003 | Rossman et al. | |
| 8,075,952 B2 | 12/2011 | Yim et al. | |
| 2002/0164421 A1* | 11/2002 | Chiang et al. | 427/248.1 |
| 2003/0032301 A1 | 2/2003 | Dhindsa et al. | |
| 2005/0233093 A1* | 10/2005 | Tada et al. | 427/569 |
| 2006/0040055 A1* | 2/2006 | Nguyen et al. | 427/248.1 |
| 2006/0127601 A1* | 6/2006 | Murakami et al. | 427/569 |

* cited by examiner

*Primary Examiner* — Kelly M Gambetta
(74) *Attorney, Agent, or Firm* — Patterson & Sheridan, LLP

(57) ABSTRACT

A method for preventing particle contamination within a processing chamber is disclosed. Preheating the substrate within the processing chamber may cause a thermophoresis effect so that particles within the chamber that are not adhered to a surface may not come to rest on the substrate. One method to increase the substrate temperature is to plasma load the substrate. Plasma loading comprises providing an inert gas plasma to the substrate to heat the substrate. Another method to increase the substrate temperature is high pressure loading the substrate. High pressure loading comprises heating the substrate while increasing the chamber pressure to between about 1 Torr and about 10 Torr. By rapidly increasing the substrate temperature within the processing chamber prior to substrate processing, particle contamination is less likely to occur.

14 Claims, 3 Drawing Sheets

POWER LOADING SUBSTRATES TO REDUCE PARTICLE CONTAMINATION

CROSS-REFERENCE TO RELATED APPLICATIONS

This application is a continuation of U.S. patent application Ser. No. 11/478,279, filed Jun. 29, 2006, now U.S. Pat. No. 8,075,952, which is incorporated by reference herein.

BACKGROUND OF THE INVENTION

1. Field of the Invention

Embodiments of the present invention generally relate to a process for preventing particle contamination in processing chambers.

2. Description of the Related Art

Plasma generated particles are an important source of contamination in device manufacturing. During plasma processing, particles may form on the chamber walls and eventually flake off. Particles may flake off when the chamber door is opened or closed. When the particles flake off, they may float around in the chamber and come to rest on the chamber surface without adhering to the surface. When the chamber door is reopened to place another substrate into the chamber, the gush of air or change in pressure or temperature may cause the non-adhered particles to stir up and float around the chamber. The particles may then come to rest once stability is reached. If the particles come to rest on the incoming substrate, then the substrate has been contaminated. The chamber may be periodically cleaned, but to clean the chamber after each substrate is processed is quite time consuming and may result in decreased substrate throughput.

There is a need in the art to prevent particle contamination within a processing chamber on a substrate to substrate basis.

SUMMARY OF THE INVENTION

The present invention generally comprises a method for preventing particle contamination within a processing chamber. Preheating the substrate within the processing chamber may cause a thermophoresis effect so that particles within the chamber that are not adhered to a surface may not come to rest on the substrate. One method to increase the substrate temperature is to plasma load the substrate. Plasma loading comprises providing an inert gas plasma to the substrate to heat the substrate. Another method to increase the substrate temperature is high pressure loading the substrate. High pressure loading comprises heating the substrate while increasing the chamber pressure to between about 1 Torr and about 10 Torr. By rapidly increasing the substrate temperature within the processing chamber prior to substrate processing, particle contamination is less likely to occur.

In one embodiment, a method for processing a substrate is disclosed. The method comprises plasma loading the substrate and providing a separate deposition plasma within the chamber to deposit a material layer over the substrate. The plasma loading comprises providing an inert plasma within the chamber to heat the substrate. The providing a separate deposition plasma occurs after the plasma loading.

In another embodiment, a method for processing a substrate is disclosed. The method comprises high pressure loading the substrate within the chamber and providing a deposition plasma within the chamber to deposit a material layer over the heated substrate. The high pressure loading comprises raising the pressure within the chamber to about 1 Torr to about 10 Torr and heating the substrate while the chamber is maintained at the pressure of about 1 Torr to about 10 Torr. The high pressure loading occurs in the absence of plasma. The high pressure loading occurs prior to providing the deposition plasma.

In another embodiment, a substrate processing apparatus is disclosed. The apparatus comprises a showerhead, a substrate support having a substrate receiving surface, heating elements adapted to heat a substrate on the substrate receiving surface, a power supply coupled to the showerhead, and a controller. The controller is programmed to increase the pressure of the chamber to about 1 Torr to about 10 Torr, provide an inert plasma to heat the substrate and provide a separate deposition plasma after the inert plasma.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises a method for preventing particle contamination within a processing chamber. Preheating the substrate within the processing chamber may cause a thermophoresis effect so that particles within the chamber that are not adhered to a surface may not come to rest on the substrate. One method to increase the substrate temperature is to plasma load the substrate. Plasma loading comprises providing an inert gas plasma to the substrate to heat the substrate. Another method to increase the substrate temperature is high pressure loading the substrate. High pressure loading comprises heating the substrate while increasing the chamber pressure to between about 1 Torr and about 10 Torr. By rapidly increasing the substrate temperature within the processing chamber prior to substrate processing, particle contamination is less likely to occur. Plasma loading and high pressure loading are two forms of power loading.

PECVD System

Figure 1:
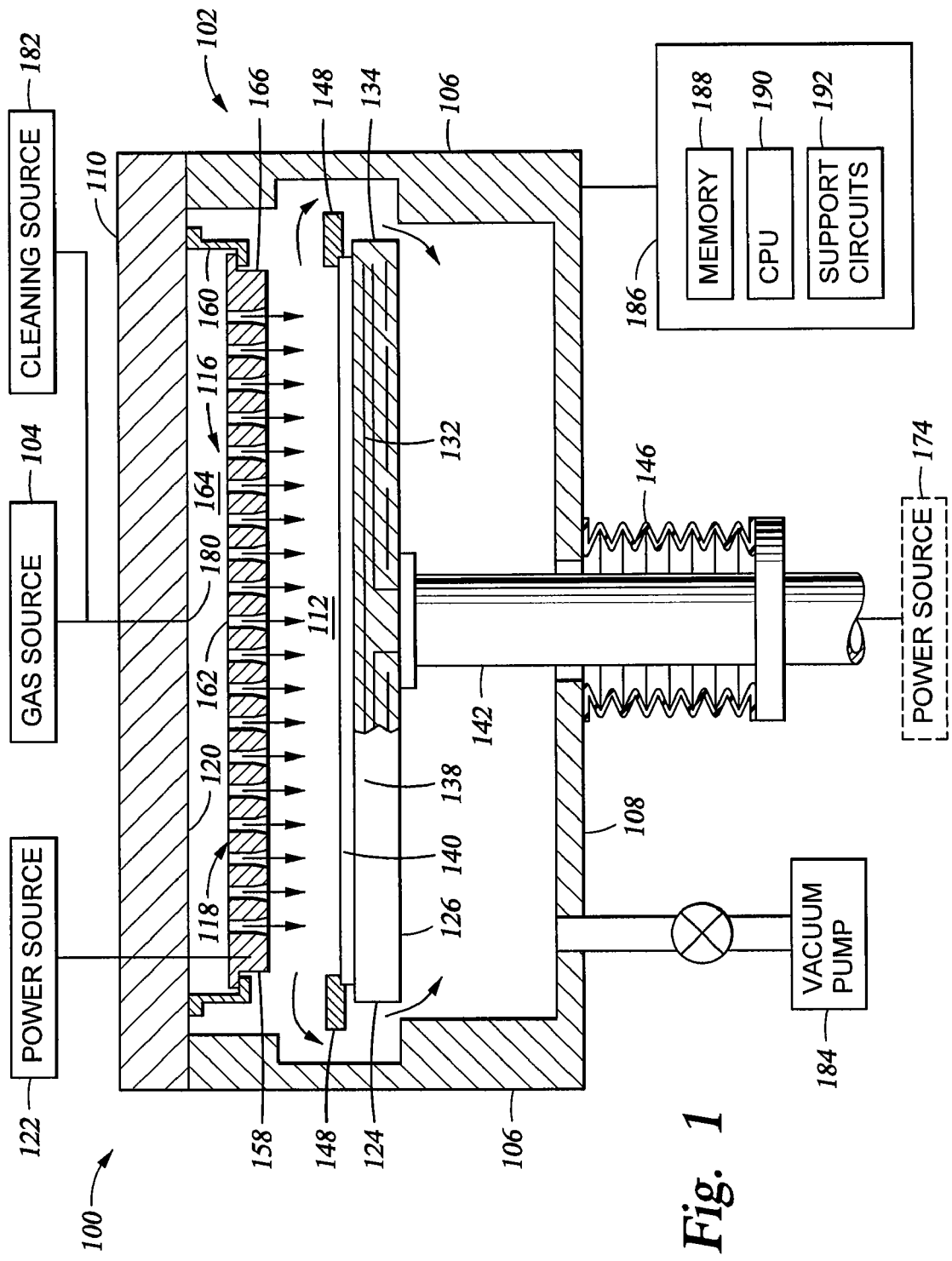
FIG. 1 illustrates a sectional view of a plasma enhanced chemical vapor deposition (PECVD) chamber that may be used in connection with one or more embodiments of the invention.

FIG. 1 is a schematic cross-sectional view of one embodiment of a plasma enhanced chemical vapor deposition (PECVD) system 100, available from AKT®, a division of Applied Materials, Inc., Santa Clara, Calif. The system 100 generally includes a processing chamber 102 coupled to a gas source 104. The processing chamber 102 has walls 106 and a bottom 108 that partially define a process volume 112. The process volume 112 is typically accessed through a port (not shown) in the walls 106 that facilitate movement of a substrate 140 into and out of the processing chamber 102. The walls 106 and bottom 108 are typically fabricated from a unitary block of aluminum or other material compatible with processing. The walls 106 support a lid assembly 110. The processing chamber 102 can be evacuated by a vacuum pump 184.

A temperature controlled substrate support assembly 138 is centrally disposed within the processing chamber 102. The support assembly 138 supports a substrate 140 during processing. In one embodiment, the substrate support assembly 138 comprises an aluminum body 124 that encapsulates at least one embedded heater 132. The heater 132, such as a resistive element, disposed in the support assembly 138, is coupled to an optional power source 174 and controllably heats the support assembly 138 and the substrate 140 positioned thereon to a predetermined temperature. Typically, in a CVD process, the heater 132 maintains the substrate 140 at a uniform temperature between about 150 degrees Celsius to at least about 460 degrees Celsius, depending on the deposition processing parameters for the material being deposited.

The substrate support assembly 138 may include a two zone embedded heater. One zone may be an inner heating zone that is located near the center of the substrate support assembly 138. The outer heating zone may be located near the outer edge of the substrate support assembly 138. The outer heating zone may be set to a higher temperature do to higher thermal losses that may occur at the edge of the substrate support assembly 138. An exemplary two zone heating assembly that may be used to practice the present invention is disclosed in U.S. Pat. No. 5,844,205, which is hereby incorporated by reference in its entirety.

Generally, the support assembly 138 has a lower side 126 and an upper side 134. The upper side 134 supports the substrate 140. The lower side 126 has a stem 142 coupled thereto. The stem 142 couples the support assembly 138 to a lift system (not shown) that moves the support assembly 138 between an elevated processing position (as shown) and a lowered position that facilitates substrate transfer to and from the processing chamber 102. The stem 142 additionally provides a conduit for electrical and thermocouple leads between the support assembly 138 and other components of the system 100.

A bellows 146 is coupled between support assembly 138 (or the stem 142) and the bottom 108 of the processing chamber 102. The bellows 146 provides a vacuum seal between the chamber volume 112 and the atmosphere outside the processing chamber 102 while facilitating vertical movement of the support assembly 138.

The support assembly 138 generally is grounded such that RF power supplied by a power source 122 to a gas distribution plate assembly 118 positioned between the lid assembly 110 and substrate support assembly 138 (or other electrode positioned within or near the lid assembly of the chamber) may excite gases present in the process volume 112 between the support assembly 138 and the distribution plate assembly 118. The RF power from the power source 122 is generally selected commensurate with the size of the substrate to drive the chemical vapor deposition process.

The support assembly 138 additionally supports a circumscribing shadow frame 148. Generally, the shadow frame 148 prevents deposition at the edge of the substrate 140 and support assembly 138 so that the substrate does not stick to the support assembly 138.

The lid assembly 110 provides an upper boundary to the process volume 112. The lid assembly 110 typically can be removed or opened to service the processing chamber 102. In one embodiment, the lid assembly 110 is fabricated from aluminum (Al).

The lid assembly 110 typically includes an entry port 180 through which process gases provided by the gas source 104 are introduced into the processing chamber 102. The entry port 180 is also coupled to a cleaning source 182. The cleaning source 182 typically provides a cleaning agent, such as disassociated fluorine, that is introduced into the processing chamber 102 to remove deposition by-products and films from processing chamber hardware, including the gas distribution plate assembly 118.

The gas distribution plate assembly 118 is coupled to an interior side 120 of the lid assembly 110. The gas distribution plate assembly 118 is typically configured to substantially follow the profile of the substrate 140, for example, polygonal for large area flat panel substrates and circular for substrates. The gas distribution plate assembly 118 includes a perforated area 116 through which process and other gases supplied from the gas source 104 are delivered to the process volume 112. The perforated area 116 of the gas distribution plate assembly 118 is configured to provide uniform distribution of gases passing through the gas distribution plate assembly 118 into the processing chamber 102. Gas distribution plates that may be adapted to benefit from the invention are described in commonly assigned U.S. Pat. Nos. 6,477,980; 6,772,827; 7,008,484; 6,942,753 and United States Patent Published Application Nos. 2004/0129211 A1, which are hereby incorporated by reference in their entireties.

The gas distribution plate assembly 118 typically includes a diffuser plate 158 suspended from a hanger plate 160. The diffuser plate 158 and hanger plate 160 may alternatively comprise a single unitary member. A plurality of gas passages 162 are formed through the diffuser plate 158 to allow a predetermined distribution of gas passing through the gas distribution plate assembly 118 and into the process volume 112. The hanger plate 160 maintains the diffuser plate 158 and the interior surface 120 of the lid assembly 110 in a spaced-apart relation, thus defining a plenum 164 therebetween. The plenum 164 allows gases flowing through the lid assembly 110 to uniformly distribute across the width of the diffuser plate 158 so that gas is provided uniformly above the center perforated area 116 and flows with a uniform distribution through the gas passages 162.

The diffuser plate 158 is typically fabricated from stainless steel, aluminum, anodized aluminum, nickel or other RF conductive material. The diffuser plate 158 is configured with a thickness that maintains sufficient flatness across the aperture 166 as not to adversely affect substrate processing. In one embodiment the diffuser plate 158 has a thickness between about 1.0 inch to about 2.0 inches. The diffuser plate 158 could be circular for semiconductor substrate manufacturing or polygonal, such as rectangular, for flat panel display manufacturing.

As shown in FIG. 1, a controller 186 is included to interface with and control various components of the substrate processing system. The controller 186 typically includes a central processing unit (CPU) 190, support circuits 192 and a memory 188.

PVD System

Figure 2:
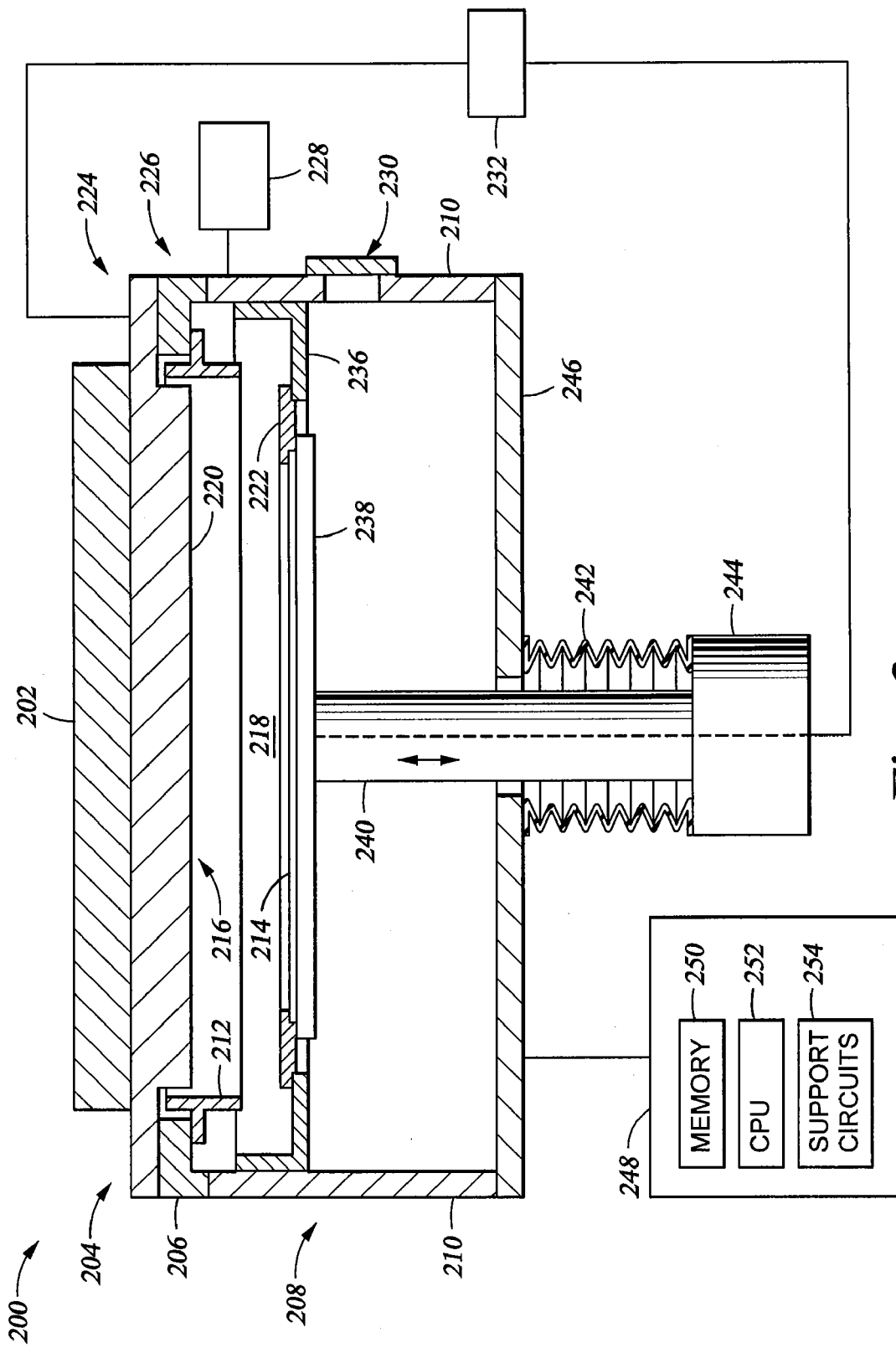
FIG. 2 illustrates a sectional view of one exemplary physical vapor deposition (PVD) chamber that may be used in connection with one or more embodiments of the invention.

FIG. 2 illustrates an exemplary physical vapor deposition (PVD) process chamber 200 for depositing material onto a substrate 214 according to one embodiment of the invention. One example of the process chamber 200 that may be adapted to benefit from the invention is a PVD process chamber, available from AKT®, a division of Applied Materials, Inc., located in Santa Clara, Calif.

The process chamber 200 includes a chamber body 208 and a lid assembly 204, defining a process volume 218. The chamber body 208 includes sidewalls 210 and a bottom 246. The sidewalls 210 and/or bottom 246 include a plurality of apertures, such as an access port 230 and a pumping port (not shown). The lid assembly 204 generally includes a target 220 and a ground shield assembly 226 coupled thereto. The target 220 generally includes a peripheral portion 224 and a central portion 216. The peripheral portion 224 is disposed over the sidewalls 210 of the chamber. The central portion 216 of the target 220 may protrude, or extend in a direction towards a substrate support 238.

Optionally, the lid assembly 204 may further comprise a magnetron assembly 202, which enhances consumption of the target material during processing. Referring back to FIG. 2, during a sputtering process to deposit a material on the substrate 214, the target 220 and the substrate support 238 are biased relative each other by the power source 232. A process gas, such as inert gas and other gases (i.e., argon, and nitrogen) is supplied to the process volume 218 from a gas source 228 through one or more apertures (not shown), typically formed in the sidewalls 210 of the process chamber 200.

The ground shield assembly 226 includes a ground frame 206, a ground shield 212, or any chamber shield member, target shield member, dark space shield, dark space shield frame, etc. A shaft 240 extends through the bottom 246 of the chamber body 208 and couples the substrate support 238 to a lift mechanism 244. A shadow frame 222 and a chamber shield 236 may be disposed within the chamber body 208.

As shown in FIG. 2, a controller 248 is included to interface with and control various components of the substrate processing system. The controller 248 typically includes a central processing unit (CPU) 252, support circuits 254 and a memory 250.

Particles and Thermophoresis

Particles may collect within a processing chamber when a process has completed. Particles are attracted to the coolest surface. When a substrate enters a processing chamber, its temperature may be at room temperature or another temperature that is less than anything else within the process chamber. Therefore, particles may collect on the substrate and contaminate the substrate. The particles may be present because of flaking from the chamber or simply dust-like particles that are floating within the chamber after a process. The particles tend to be negatively charged because electrons have greater mobility than positive ions. The particles are sensitive to forces associated with gradients in neutral gas temperatures.

Thermophoresis is a phenomenon whereby negatively charged particles move away from a heated electrode and towards a cooled electrode. By heating an element that is desired to be free of contaminants to the temperature of the surroundings, particles may not gravitate towards the element any more than towards any other item within the chamber. Jellum et al. in an article entitled Particle thermophoresis in low pressure glow discharges, *J. Appl. Phys.* 69 (10), May 15, 1991 pp. 6923-6934, which is incorporated herein by reference, discusses the phenomenon in greater detail.

Thermophoresis in Practice

Heating the substrate to the temperature greater than its surroundings is a solution to preventing particle contamination on a substrate during processing. Naturally, a dedicated preheating chamber would be beneficial. Few particles would be present in a preheating chamber because no deposition or etching occurs in the preheating chamber. The temperature of the substrate may effectively be raised without contamination from flaking. There is a drawback to a dedicated preheating chamber; it takes up a valuable chamber location in a cluster tool. An exemplary cluster tool system that can be used to practice the present invention is the AKT® 50K cluster tool system. By preheating within the processing chamber itself, processing chambers do not need to be sacrificed for a preheating chamber.

In order to perform thermophoresis within a processing chamber, the substrate may need to be rapidly heated to a temperature greater than a processing chamber temperature so that the particles do not settle on the substrate. For a PECVD system, the substrate may be heated to a temperature greater than the temperature of the showerhead. When the substrate is heated to a temperature greater than the showerhead, the substrate is no longer the coolest surface within the chamber. As negatively charged particles tend to gravitate towards the coolest surface, contaminating particles may tend to gravitate away from the substrate once the substrate is at a temperature greater than the showerhead.

One method for heating the substrate is plasma loading the substrate. For the plasma loading method, the substrate is placed into the processing chamber. In one embodiment, the processing chamber is a deposition chamber. In another embodiment, the processing chamber is a PECVD chamber. In another embodiment, the processing chamber is a PVD chamber. In another embodiment, the processing chamber is an etching chamber. Thereafter, the processing chamber is sealed so that the plasma loading and processing can occur. The pressure of the chamber is increased to about 1 Torr to about 10 Torr. An inert gas plasma is then provided. The inert gas may be noble gas such as argon, krypton, xenon, helium, or neon, or other gases such as nitrogen and hydrogen. In one embodiment, the plasma is formed remotely and provided to the chamber. In another embodiment, the plasma is ignited within the chamber. The plasma then heats the substrate. After the plasma loading has completed (i.e., the temperature of the substrate is raised to a temperature greater than the showerhead in a PECVD chamber), substrate processing may begin within the chamber. During the plasma loading, the susceptor may move up to engage the substrate either before the plasma is introduced to the chamber or after the plasma is introduced into the chamber. The same chamber that performs the plasma loading may perform the substrate processing (i.e., deposition, etching, etc.).

The substrate may be plasma loaded either before or after the substrate is in its processing position. The processing position is the location within the chamber where the processing (i.e., etching, deposition, etc.) will occur. To place the substrate in the processing position, the susceptor may be raised to a location that provides the proper spacing between the substrate and the showerhead (PECVD) or the target (PVD). When the plasma loading occurs before the substrate is in the processing position, valuable processing time can be saved.

Figure 3:
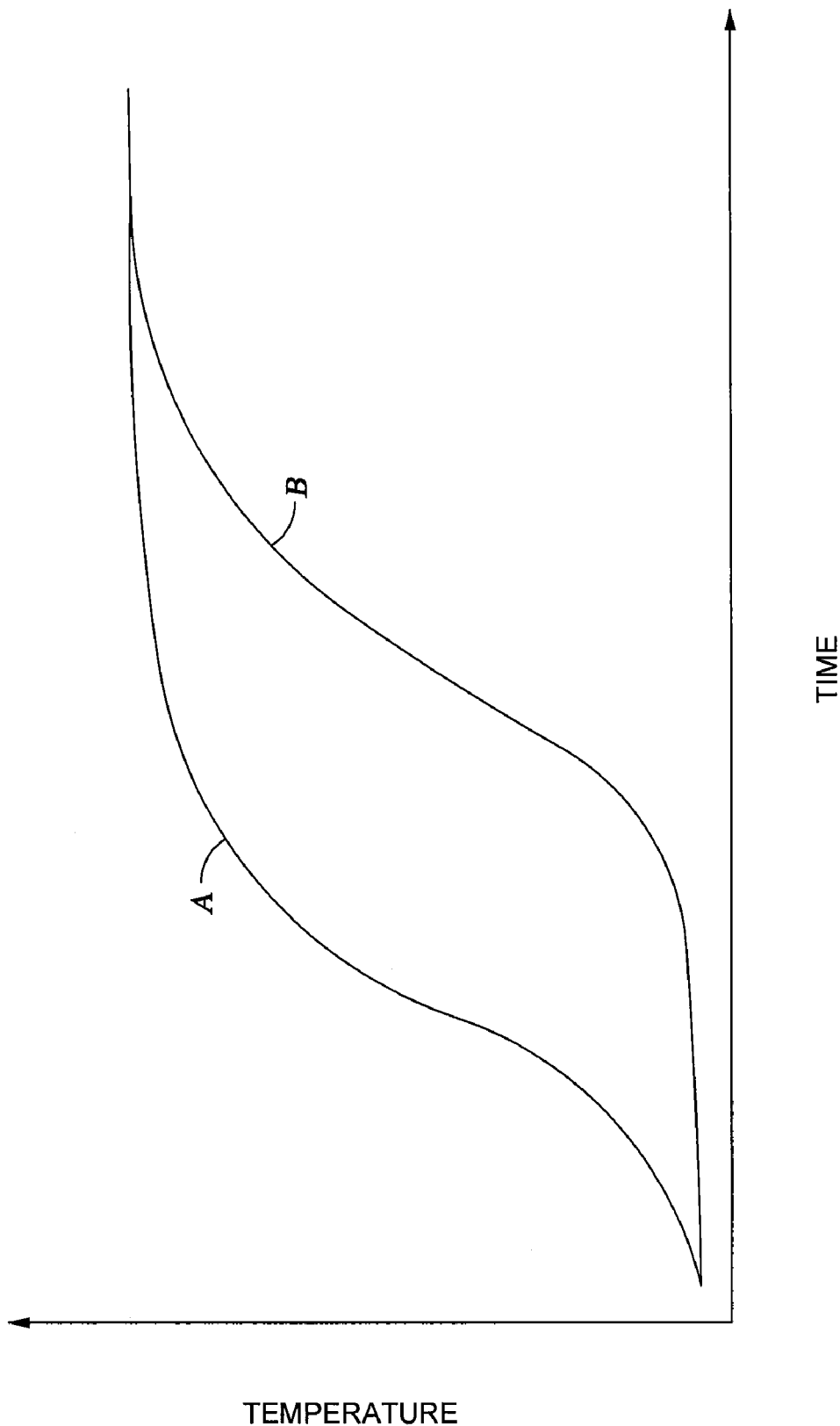
FIG. 3 shows a graph comparing temperature versus time.

In addition to the inert gas plasma, the substrate may be heated by a susceptor. The combination of the plasma and the susceptor heater can rapidly increase the temperature of the substrate so that particles do not rest on and contaminate the substrate. FIG. 3 shows a comparison of heating the substrate by using only a susceptor heater (shown at line "B") and by using the susceptor heater and plasma (shown at line "A"). As can be seen from FIG. 3, the susceptor heater and plasma together may increase the temperature of the substrate faster than the susceptor heater alone. By heating the substrate with the susceptor heater only, particles are likely to land on the substrate because the temperature of the substrate is low for a longer period of time. The substrate may be any suitable substrate such as a substrate for a flat panel display, a semiconductor substrate, a substrate for a solar panel, or any other suitable substrate. In one embodiment, the substrate is an insulating substrate such as glass.

In one embodiment, the showerhead may have a temperature of about 200 degrees Celsius. The substrate may enter the processing chamber at about room temperature (i.e., about 25 degrees Celsius). The substrate may then be heated to a temperature greater than the temperature of the showerhead by heating the substrate with the susceptor and an inert gas plasma. The susceptor may be a two zone heating susceptor as described above. In one embodiment, the outer zone may be heated to a temperature of about 360 degrees Celsius while the inner zone may be heated to a temperature of about 340 degrees Celsius. The inert gas plasma and the susceptor heating may cause the substrate temperature to rise from room temperature to about 300 degrees Celsius. The temperature of the substrate may rise at a rate of about 30 degrees Celsius per second.

TABLE I

|  | Example 1 | Example 2 | Example 3 | Example 4 |
|---|---|---|---|---|
| Process Pressure (Torr) | 3 | 3 | 3 | 3 |
| RF Power (W) | 3,000 | 4,000 | 5,000 | 6,000 |
| Process Spacing (mils) | 1,100 | 1,100 | 1,100 | 1,100 |
| Gas Flow Rate (slm) | 20 | 40 | 60 | 80 |

Table I shows the processing conditions for four separate examples of plasma loading with nitrogen plasma in a PECVD chamber. For each example, the process pressure was 3 Torr, and the spacing between the substrate and the showerhead was 1,100 mils. For the PECVD chamber, the showerhead is grounded and is about 200 degrees Celsius. Note that the deposition will occur in the same chamber as the plasma loading with nitrogen plasma. By preheating in the same chamber as the deposition, valuable processing chamber space can be saved in a cluster tool system. The substrate is grounded as well. If the substrate is not grounded, the substrate may etch. For each substrate in Table I, the thickness was 0.7 mm.

In example 1, RF power was supplied to the showerhead at 3,000 W and nitrogen was provided as the inert gas. The nitrogen was provided at a flow rate of 20 slm. The time to heat the substrate to a temperature greater than the showerhead was about 10.

In example 2, RF power was supplied to the showerhead at 4,000 W and nitrogen was provided as the inert gas. The nitrogen was provided at a flow rate of 40 slm. The time to heat the substrate to a temperature greater than the showerhead was about 8.

In example 3, RF power was supplied to the showerhead at 5,000 W and nitrogen was provided as the inert gas. The nitrogen was provided at a flow rate of 60 slm. The time to heat the substrate to a temperature greater than the showerhead was about 6.

In example 4, RF power was supplied to the showerhead at 6,000 W and nitrogen was provided as the inert gas. The nitrogen was provided at a flow rate of 80 slm. The time to heat the substrate to a temperature greater than the showerhead was about 5.

As can be seen from the examples, by increasing the RF power supplied to the showerhead and increasing the flow rate of the nitrogen gas, the substrate temperature was increased at a faster rate. The faster that the substrate can be heated to a temperature greater than the showerhead, the less likely contamination particles may lay down on the substrate.

Another method for thermophoresis in processing chambers involves high pressure loading of the substrate. High pressure loading is similar to the plasma loading except that no plasma is used.

The chamber pressure should be kept lower than about 10 Torr because at pressures greater than about 10 Torr, substrate throughput can be affected. At the higher pressures (i.e., 1 Torr to about 10 Torr), the substrate temperature will increase at a faster rate than at atmospheric pressure.

The time to heat up the substrate may vary greatly with substrate thickness. For example while only 10 seconds are necessary to heat up a substrate in Example 1, when the substrate is increased in thickness to 5 mm, the time may be about 300 seconds. In the case of high pressure loading, it takes 28 seconds to heat the substrate from room temperature to 350 degrees Celsius, but for a 5 mm thick substrate, the time is about 600 seconds. The time to heat up the substrate will increase exponentially with an increase in thickness.

In one example of high pressure loading, a showerhead had a temperature of about 250 degrees Celsius and a susceptor had a temperature of about 360 degrees Celsius for both the inner and outer heating zones in a PECVD chamber. A 0.7 mm thick substrate was brought into the chamber at about 100 degrees Celsius. The susceptor heated the substrate while the chamber was maintained at a pressure of 5 Torr. After about 17 seconds, the substrate reached the temperature of the showerhead. After about 37 seconds, the substrate was at a relatively stable temperature of about 340 degrees Celsius. During the high pressure loading, no gas flow was provided to the chamber.

By preheating the substrate to the processing chamber temperature at a rapid rate, particle contamination may be avoided. Preheating within the same processing chamber increases substrate throughput because a separate dedicated preheating chamber is not necessary. Additionally, particle contamination may be avoided during a processing sequence without stopping the process to clean the chamber.

While the foregoing is directed to embodiments of the present invention, other and further embodiments of the invention may be devised without departing from the basic scope thereof, and the scope thereof is determined by the claims that follow.

We claim:

1. A method of processing a substrate within a processing chamber, comprising:

high pressure loading a substrate within a processing chamber, wherein the high pressure loading comprises raising a pressure within the processing chamber to about 1 Torr to about 10 Torr and heating the substrate while the processing chamber is maintained at the pressure of about 1 Torr to about 10 Torr and no gas flow is provided to the processing chamber, wherein the high pressure loading occurs in the absence of a plasma; and subsequent to high pressure loading the substrate, depositing a material layer on the heated substrate in the presence of a deposition plasma within the processing chamber.

2. The method of claim 1, wherein the depositing comprises performing a plasma enhanced chemical vapor deposition process or a physical vapor deposition process.

3. The method of claim 1, wherein the substrate is heated during high pressure loading to a temperature greater than a showerhead of the processing chamber.

4. The method of claim 1, wherein the substrate is grounded.

5. The method of claim 1, wherein depositing comprises igniting the deposition plasma within the processing chamber.

6. The method of claim 1 further comprising:
transferring the substrate into the processing chamber prior to high pressure loading, wherein a temperature of the substrate is about room temperature.

7. The method of claim 1 further comprising:
raising the substrate to a processing position within the processing chamber after high pressure loading and prior to depositing the material layer.

8. The method of claim 1 further comprising:
heating an outer heating zone of a susceptor supporting the substrate to a temperature greater than an inner heating zone of the susceptor.

9. The method of claim 1, wherein the substrate is a flat panel display substrate or a solar panel substrate.

10. The method of claim 1, wherein depositing comprises:
igniting the deposition plasma remotely from the processing chamber.

11. The method of claim 1, wherein the high pressure loading further comprises heating the substrate while raising the pressure within the processing chamber to the pressure of about 1 Torr to about 10 Torr.

12. The method of claim 11, further comprising:
heating an outer heating zone and an inner heating zone of at least a two zone heating susceptor supporting the substrate such that the outer heating zone of the susceptor has a temperature greater than the inner heating zone of the susceptor.

13. The method of claim 12, wherein the substrate is heated to a temperature greater than a temperature of a showerhead.

14. The method of claim 13, wherein the substrate is a flat panel display substrate or a solar panel substrate.

* * * * *